United States Patent
Kawabata (10) Patent No.: US 10,114,151 B2
(45) Date of Patent: Oct. 30, 2018

(54) SOLID-STATE IMAGE SENSOR AND CAMERA

(71) Applicant: CANON KABUSHIKI KAISHA, Tokyo (JP)

(72) Inventor: Kazunari Kawabata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 218 days.

(21) Appl. No.: 15/136,017

(22) Filed: Apr. 22, 2016

(65) Prior Publication Data

US 2016/0334550 A1    Nov. 17, 2016

(30) Foreign Application Priority Data

May 14, 2015    (JP) ................................. 2015-099511

(51) Int. Cl.
*G02B 3/00* (2006.01)
*H04N 5/378* (2011.01)
(Continued)

(52) U.S. Cl.
CPC ......... *G02B 3/0043* (2013.01); *G02B 3/0056* (2013.01); *H01L 27/14627* (2013.01);
(Continued)

(58) Field of Classification Search
CPC ............... G02B 3/0043; G02B 3/0056; G02B 2003/0093; H01L 27/14685; H01L 27/14627; H04N 5/374; H04N 5/378
See application file for complete search history.

(56) References Cited

U.S. PATENT DOCUMENTS 5,662,401 A * 9/1997 Shimizu ............... G02B 3/0043
348/E5.137
7,812,302 B2    10/2010 Kuo et al.
(Continued)

FOREIGN PATENT DOCUMENTS

EP    2362257 A1    8/2011
EP    2 819 172 A1    12/2014
(Continued)

OTHER PUBLICATIONS

European Search Report issued in counterpart European Patent Application No. 16165488.4, dated Oct. 12, 2016.
(Continued)

*Primary Examiner* — Tony Ko
(74) *Attorney, Agent, or Firm* — Fitzpatrick, Cella, Harper & Scinto (57) ABSTRACT

An image sensor includes microlens array having microlenses arranged to constitute rows and columns. When first axis parallel to the rows and passing through array center of the microlens array, and second axis parallel to the columns and passing through the array center are defined, microlens positioned on virtual circle having the array center as center includes first microlens positioned on the first or second axis, and second microlens positioned on neither the first axis nor the second axis. The first and second microlens have non-circular bottom shape, and width of the second microlens in second direction passing through the second microlens and the array center is larger than width of the first microlens in first direction passing through the first microlens and the array center.

8 Claims, 7 Drawing Sheets

(51) Int. Cl.
H04N 5/374 (2011.01)
H01L 27/146 (2006.01)

(52) U.S. Cl.
CPC ....... *H01L 27/14685* (2013.01); *H04N 5/374* (2013.01); *H04N 5/378* (2013.01); *G02B 2003/0093* (2013.01)

(56) References Cited

U.S. PATENT DOCUMENTS

| | | |
|---|---|---|
| 8,102,460 B2 | 1/2012 | Awazu |
| 9,285,510 B2 | 3/2016 | Kawabata et al. |
| 2006/0023312 A1 | 2/2006 | Boettiger et al. |
| 2015/0156431 A1 | 6/2015 | Nagata et al. |
| 2016/0071896 A1 | 3/2016 | Kawabata et al. |
| 2016/0146981 A1 | 5/2016 | Kawabata et al. |

FOREIGN PATENT DOCUMENTS

| | | |
|---|---|---|
| JP | 2007-335723 A | 12/2007 |
| JP | 2009-111209 A | 5/2009 |

OTHER PUBLICATIONS

Office Action dated Oct. 25, 2017, in Russian Patent Application No. 2016118405.
Kazunari Kawabata et al., U.S. Appl. No. 15/137,474, filed Apr. 25, 2016.

\* cited by examiner

WIDTH OF 1ST PIXEL IN 1ST DIRECTION DIR1

FIG. 3B

WIDTH OF 1ST PIXEL IN 2ND DIRECTION DIR2

WIDTH OF 1ST PIXEL IN 1ST DIRECTION DIR1

FIG. 5B

WIDTH OF 1ST PIXEL IN 2ND DIRECTION DIR2

WIDTH OF 1ST PIXEL IN 1ST DIRECTION DIR1

FIG. 7B

WIDTH OF 1ST PIXEL IN 2ND DIRECTION DIR2

SOLID-STATE IMAGE SENSOR AND CAMERA

BACKGROUND OF THE INVENTION

Field of the Invention

The present invention relates to a solid-state image sensor and a camera.

Description of the Related Art

Japanese Patent Laid-Open No. 2007-335723 describes a non-circular microlens. More specifically, Japanese Patent Laid-Open No. 2007-335723 describes a solid-state image sensing element which arranges a microlens having an almost circular shape in a plan view in the central portion of a light-receiving region and arranges a microlens having a teardrop shape in a portion away from the central portion of the light-receiving region. The teardrop shape has a long axis and a short axis, and its portion having the maximum width in a direction parallel to the short axis is close to a central portion side in the light-receiving region (FIG. 2, and paragraphs 0021 and 0022 of Japanese Patent Laid-Open No. 2007-335723). The direction of the long axis matches a direction of a straight line passing through the central portion of the light-receiving region. The teardrop shape is decided in accordance with a distance from the central portion of the light-receiving region.

An inventive concept described in Japanese Patent Laid-Open No. 2007-335723 can be understood to decide the basic shape of the microlens first, and then decide the shape of each microlens by rotating the basic shape in accordance with a position where each microlens should be arranged. According to the inventive concept described in Japanese Patent Laid-Open No. 2007-335723, the microlenses equal to each other in the distance from the central portion are understood to have rotation symmetry. However, when the plurality of microlenses each having a rotation-symmetric shape are arrayed in the positions equal to each other in the distance from the central portion, there are more gaps than in arraying a plurality of circular microlenses. This may reduce light collection efficiency.

SUMMARY OF THE INVENTION

The present invention provides a technique advantageous in improving light collection efficiency.

The first aspect of the present invention provides a solid-state image sensor which includes a microlens array in which a plurality of microlenses are arrayed so as to constitute a plurality of rows and a plurality of columns, wherein when a first axis parallel to the plurality of rows and passing through an array center as a center of the microlens array, and a second axis parallel to the plurality of columns and passing through the array center are defined, microlenses, out of the plurality of microlenses, positioned on a virtual circle having the array center as a center includes a first microlens positioned on one of the first axis and the second axis, and a second microlens positioned on neither the first axis nor the second axis, each of the first microlens and the second microlens has a non-circular bottom shape, and a width of the second microlens in a second direction passing through the second microlens and the array center is larger than a width of the first microlens in a first direction passing through the first microlens and the array center.

The second aspect of the present invention provides a camera comprising: a solid-state image sensor defined as the first aspect of the present invention; and a processor configured to process a signal output from the solid-state image sensor.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

Figure 1:
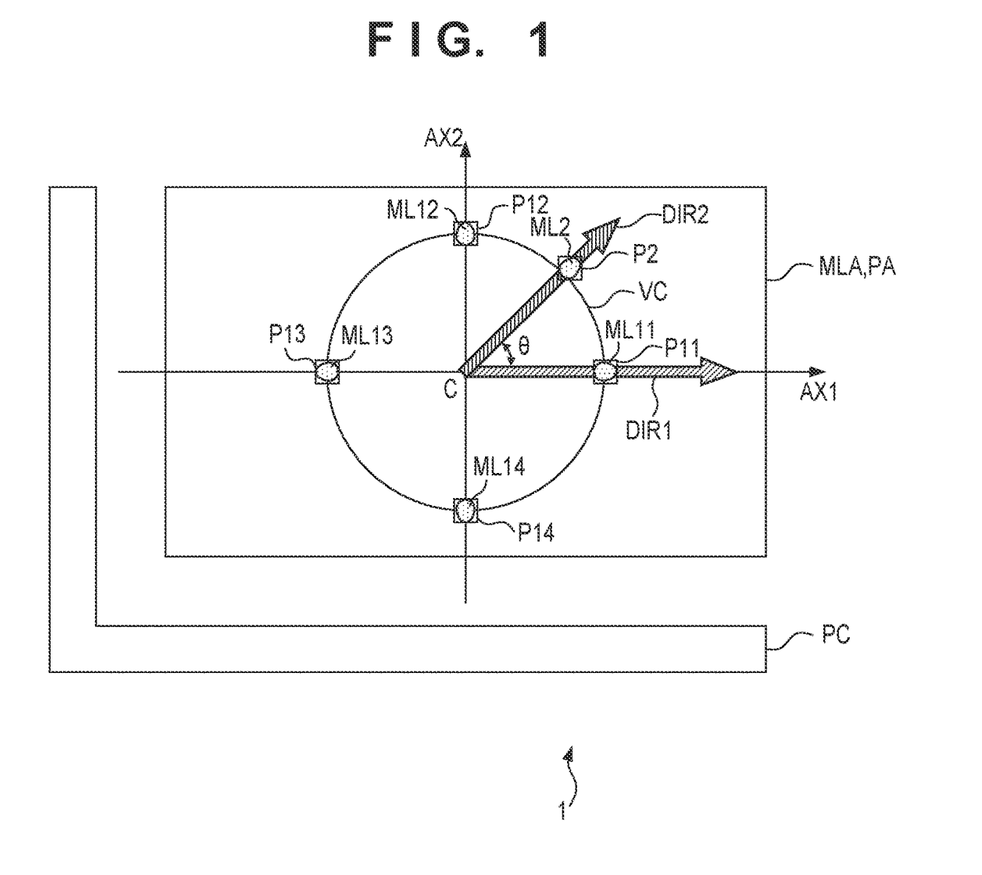
FIG. 1 is a view showing the arrangement of a solid-state image sensor according to an embodiment of the present invention.

FIG. 1 shows the arrangement of a solid-state image sensor 1 according to an embodiment of the present invention. The solid-state image sensor 1 includes a microlens array MLA in which a plurality of microlenses are arrayed so as to constitute a plurality of rows and a plurality of columns. From another viewpoint, the solid-state image sensor 1 includes a pixel array PA in which a plurality of pixels each including the microlens are arrayed so as to constitute the plurality of rows and the plurality of columns. Each pixel which constitutes the pixel array PA includes, in addition to the microlens, a photoelectric converter such as a photodiode. Each pixel can also include a color filter. Each pixel can further include a circuit in pixel configured to read out a signal from the photoelectric converter. Each circuit in pixel can include, for example, an amplification transistor which outputs a signal corresponding to charges generated in the photoelectric converter.

The solid-state image sensor 1 can further include a peripheral circuit PC. When the solid-state image sensor 1 is constituted by an MOS image sensor, the peripheral circuit PC can include, for example, a row selection circuit, a readout circuit, and a column selection circuit. The row selection circuit selects each row in the pixel array PA. The readout circuit reads out the signals from the pixel array PA. The column selection circuit selects, from the signal for one row read out by the readout circuit from the pixel array PA, one signal (the signal corresponding to the column) in a predetermined order. That is, the column selection circuit selects each column in the pixel array PA. When the solid-state image sensor 1 is constituted by a CCD image sensor, a plurality of vertical transfer CCDs are arranged in the pixel array PA and the peripheral circuit PC can include a horizontal transfer CCD.

Note that a first axis AX1 parallel to the plurality of rows of the microlens array MLA and passing through an array center C as the center of the pixel array PA, and a second axis AX2 parallel to the plurality of columns of the microlens array MLA and passing through the array center C are defined for the descriptive convenience. Further, a virtual circle VC having the array center C as the center is considered. The radius of the virtual circle VC is arbitrary. FIG. 1 shows some pixels which are positioned on the virtual circle VC out of the plurality of pixels constituting the pixel array PA. More specifically, FIG. 1 shows first pixels P11, P12, P13, and P14 and a second pixel P2 as the pixels which are positioned on the virtual circle VC out of the plurality of pixels constituting the pixel array PA. The first pixels P11, P12, P13, and P14 are positioned on the first axis AX1 or the second axis AX2. The second pixel P2 is neither positioned on the first axis AX1 nor the second axis AX2. Each pixel positioned on the first axis AX1 or the second axis AX2 can include the pixel with the first axis AX1 or the second axis AX2 crossing in a region of the pixel and/or the pixel with the first axis AX1 or the second axis AX2 contacting the boundary of the region of the pixel. FIG. 1 shows only one second pixel P2 though another second pixel exists. Each pixel positioned on the virtual circle VC can be defined as a pixel with the virtual circle VC crossing in the region of the pixel. Each pixel can have an area of a value obtained by dividing the area of the pixel array PA by the number of pixels and typically be recognized as a polygonal region such as a rectangular region.

The plurality of microlenses constituting the microlens array MLA include first microlenses ML11, ML12, ML13, and ML14 and a second microlens ML2. The first microlenses ML11, ML12, ML13, and ML14 are the microlenses of the first pixels P11, P12, P13, and P14, respectively. The second microlens ML2 is the microlens of the second pixel P2. That is, the microlenses positioned on the virtual circle VC out of the plurality of microlenses constituting the microlens array MLA include the first microlenses ML11, ML12, ML13, and ML14 and the second microlens ML2. The first microlenses ML11, ML12, ML13, and ML14 are positioned on the first axis AX1 or the second axis AX2. The second microlens ML2 is neither positioned on the first axis AX1 nor the second axis AX2.

An angle formed by the first axis AX1 and a second direction DIR2 can be defined as an argument θ. Note that the second direction DIR2 and the argument θ can be understood as a parameter which provides polar coordinates indicating the position of the second microlens ML2 (second pixel P2). The second direction DIR2 and the argument θ depend on the position of the second pixel P2.

Typically, each of the first pixels and the second pixel arranged at a predetermined distance or more away from the array center C can include a non-circular bottom shape. On the other hand, each of the first pixels and the second pixel arranged at the predetermined distance or less away from the array center C can include a circular bottom shape. The predetermined distance can be determined arbitrarily and can be a distance of 10%, 20%, 30%, or 40% of each short side of the pixel array PA. Considering the virtual circle VC with the array center C as the center and the radius larger than the predetermined distance, each of the first microlenses of the first pixels P11, P12, P13, and P14 and the second microlens of the second pixel P2 has the non-circular bottom shape.

The width of the second microlens ML2 in the second direction DIR2 passing through the second microlens ML2 and the array center C is larger than the width of the first microlens ML11 in a first direction DIR1 passing through the first microlens ML11 and the array center C. Likewise, the width of the second microlens ML2 in the second direction DIR2 passing through the second microlens ML2 and the array center C is larger than the width of the first microlens ML12 in the first direction DIR1 passing through the first microlens ML12 and the array center C. Likewise, the width of the second microlens ML2 in the second direction DIR2 passing through the second microlens ML2 and the array center C is larger than the width of the first microlens ML13 in the first direction DIR1 passing through the first microlens ML13 and the array center C. Likewise, the width of the second microlens ML2 in the second direction DIR2 passing through the second microlens ML2 and the array center C is larger than the width of the first microlens ML14 in the first direction DIR1 passing through the first microlens ML14 and the array center C. Note that, for example, the first direction DIR1 passes through the barycenter of each first microlens and the array center C, and the second direction DIR2 passes through the barycenter of the second microlens and the array center.

In one example, the width of the second microlens ML2 in the second direction DIR2 can be increased in accordance with an increase in θ in ranges of $0°<θ≤45°$, $90°<θ≤135°$, $180°<θ≤225°$, and $270°<θ≤315°$. In one example, the width of the second microlens ML2 in the second direction DIR2 can be decreased in accordance with the increase in θ in ranges of $45°≤θ<90°$, $135°<θ≤180°$, $225°<θ≤270°$, and $315°<θ≤360°$. Such an arrangement is advantageous in improving light collection efficiency with respect to the photoelectric converter in the second pixel P2.

In one example, each of the first microlenses ML11, ML12, ML13, and ML14 can have a line-symmetric shape with respect to a straight line parallel to the first direction DIRT as a symmetrical axis, and the second microlens ML2 can have a line-symmetric shape with respect to a straight line parallel to the second direction DIR2 as a symmetrical axis.

Figure 2A:
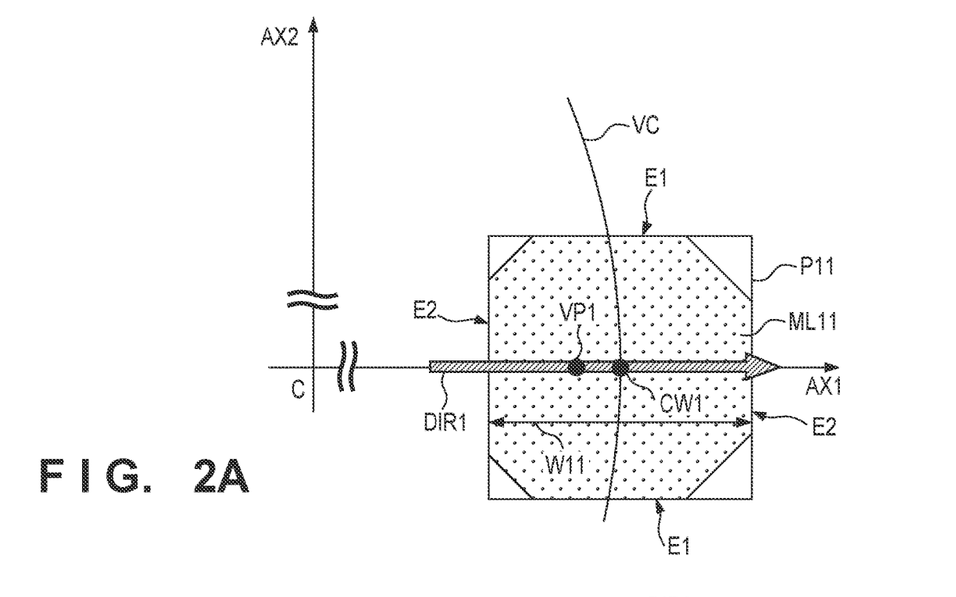
FIGS. 2A and 2B are views exemplarily showing the bottom shapes of the first microlens and the second microlens according to the first embodiment of the present invention.
Figure 2B:
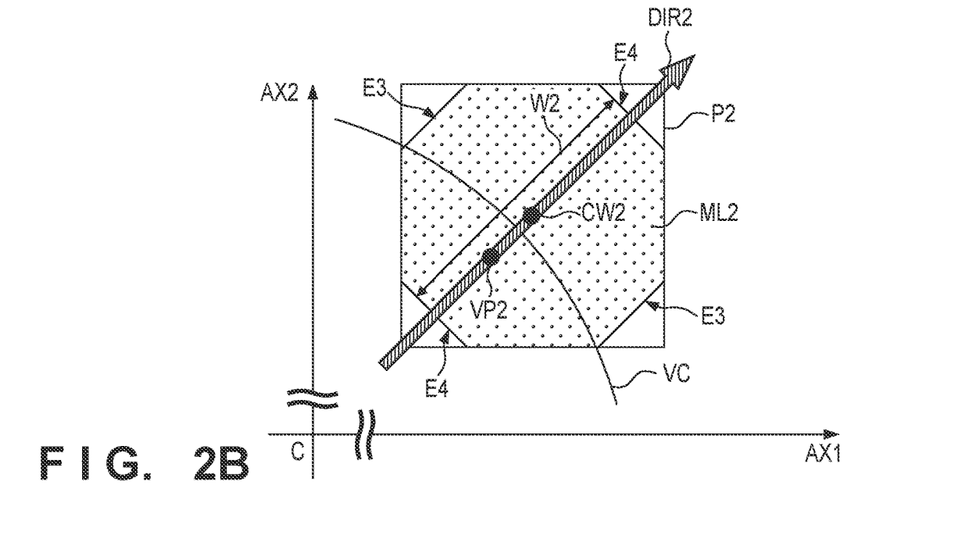
Figure 3A:
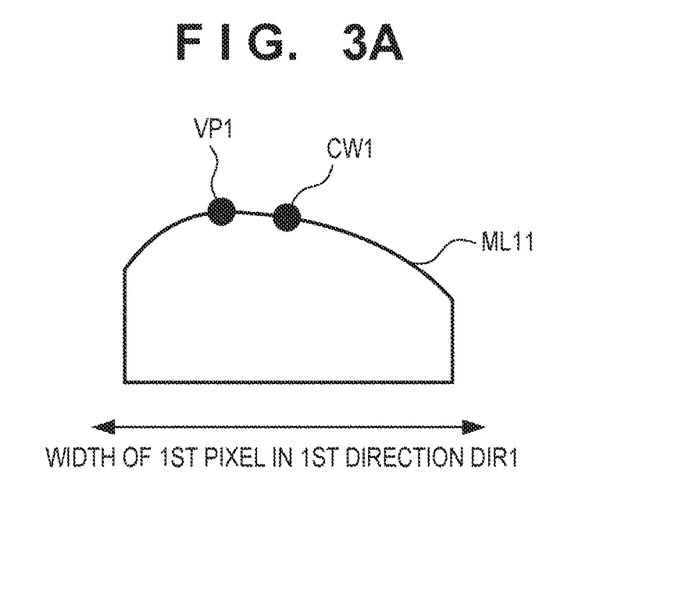
FIGS. 3A and 3B are views exemplifying the cross-sectional shapes of the first microlens and the second microlens shown in FIGS. 2A and 2B.
Figure 3B:
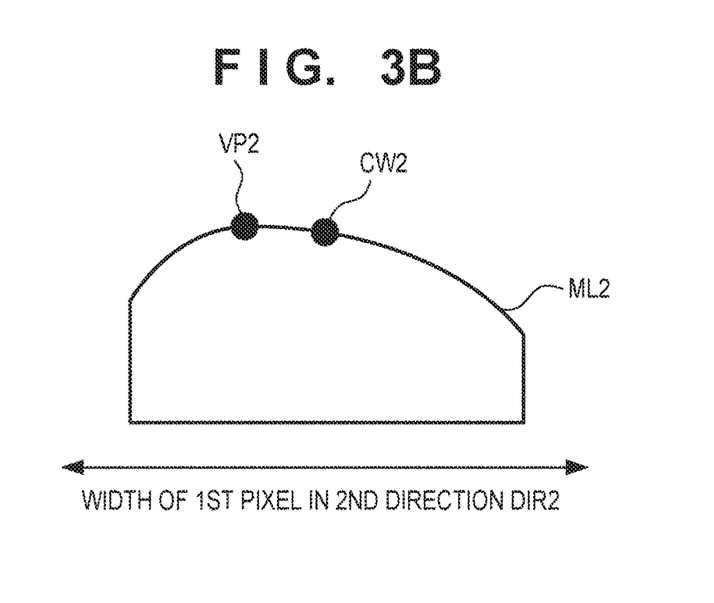

FIGS. 2A and 2B exemplarily show the bottom shapes of the first microlens ML11 and the second microlens ML2 according to the first embodiment of the present invention. The bottom shape of each microlens is the shape of a region which is occupied by the microlens projected on a plane parallel to the microlens array MLA. A width W2 of the second microlens ML2 in the second direction DIR2 passing through the second microlens ML2 and the array center C is larger than a width W11 of the first microlens ML11 in the first direction DIR1 passing through the first microlens ML11 and the array center C. Although not shown, the same also applies to the first microlenses ML12, ML13, and ML14. FIG. 3A shows a cross-sectional shape obtained by cutting the first microlens ML11 shown in FIG. 2A along the straight line parallel to the first direction DIR1. FIG. 3B exemplarily shows a cross-sectional shape obtained by cutting the second microlens ML2 shown in FIG. 2B along the straight line parallel to the second direction DIR2.

As exemplified in FIGS. 2A, 2B, 3A, and 3B, a top position VP1 of the first microlens ML11 (ditto for ML12, ML13, and ML14) is at a position shifted to the side of the array center C from a width center CW1 of the first microlens ML11 in the first direction DIR1. A top position VP2 of the second microlens ML2 is at a position shifted to the side of the array center C from a width center CW2 of the second microlens ML2 in the second direction DIR2. Such an arrangement is advantageous in collecting light rays obliquely incident on the microlenses to the photoelectric converters below the microlenses.

The cross-sectional shape of the second microlens ML2 cut along the straight line parallel to the second direction DIR2 can include a shape obtained by enlarging at least a part of the cross-sectional shape of the first microlens ML11 (ditto for ML12, ML13, and ML14) cut along the straight line parallel to the first direction DIR1. This enlargement may be done with respect to both the first direction DIR1 and a height direction or may be done with respect to only the first direction DIR1.

Alternatively, the cross-sectional shape of the second microlens ML2 cut along the straight line parallel to the second direction DIR2 may be similar to the cross-sectional shape of the first microlens ML11 (ditto for ML12, ML13, and ML14) cut along the straight line parallel to the first direction DIR1.

As exemplified in FIG. 2A, the bottom outer edge of the first microlens ML11 can include a portion E1 parallel to the first direction DIR1 and a portion E2 perpendicular to the first direction DIR1. As exemplified in FIG. 2B, the bottom outer edge of the second microlens ML2 can include a portion E3 parallel to the second direction DIR2 and a portion E4 perpendicular to the second direction DIR2.

Figure 6A:
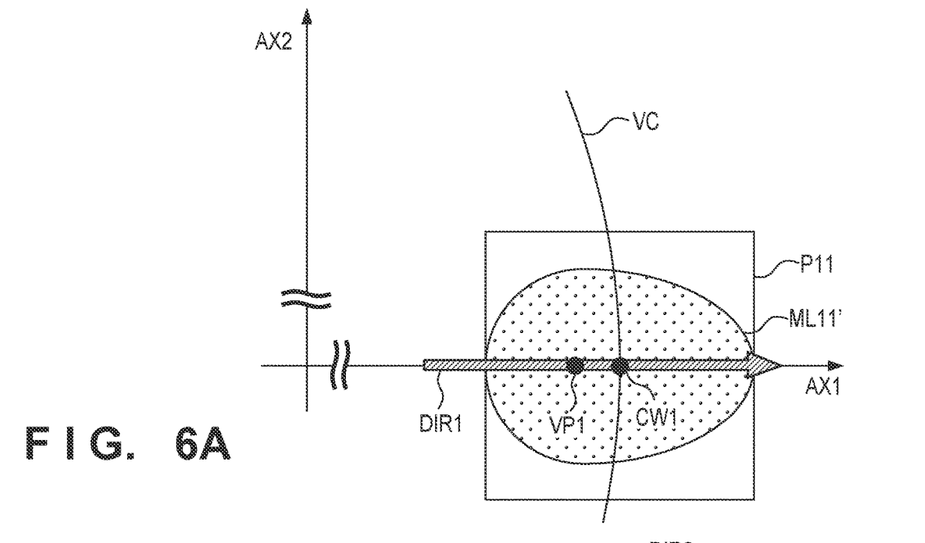
FIGS. 6A and 6B are views exemplifying the bottom shapes of the first microlens and the second microlens in a comparative example.
Figure 6B:
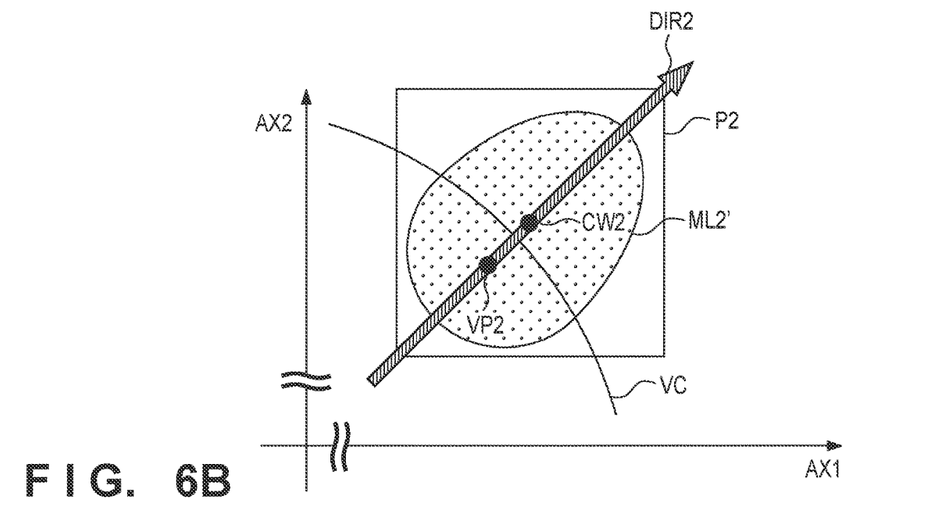
Figure 7A:
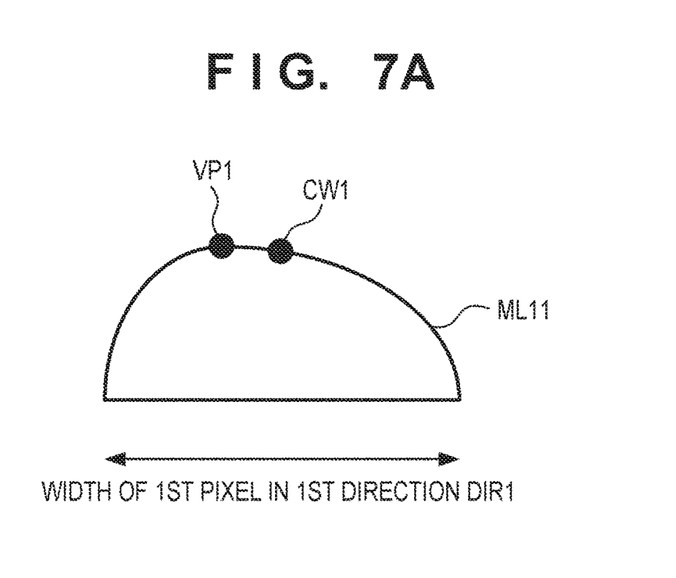
FIGS. 7A and 7B are views exemplifying the cross-sectional shapes of the first microlens and the second microlens shown in FIGS. 6A and 6B.
Figure 7B:
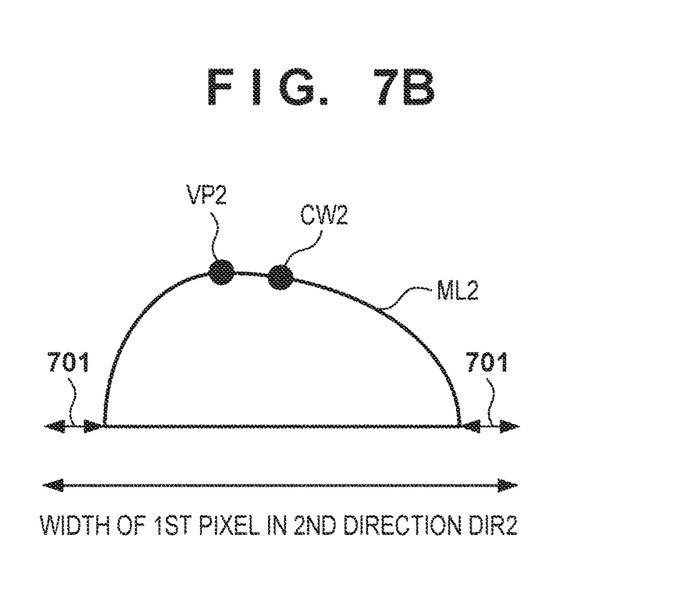

FIGS. 6A, 6B, 7A, and 7B show a comparative example. In the comparative example, each of a first microlens ML11' and a second microlens ML2' arranged on the virtual circle VC has a rotation-symmetric shape. Such an arrangement can be created when the shape of the first microlens ML11' is decided, and then the shape obtained by rotating the first microlens ML11' is decided as the shape of the second microlens ML2'. FIGS. 6A and 6B exemplarily show the bottom shape of the first microlens ML11' cut along the straight line parallel to the first direction DIR1 and the bottom shape of the second microlens ML2' cut along the straight line parallel to the second direction DIR2. FIG. 7A shows a cross-sectional shape obtained by cutting the first microlens ML11' shown in FIG. 6A along the straight line parallel to the first direction DIR1. FIG. 7B exemplarily shows a cross-sectional shape obtained by cutting the second microlens ML2' shown in FIG. 6B along the straight line parallel to the second direction DIR2.

In the comparative example, it is understood that a region 701 outside the outer edge of the second microlens ML2' is larger than in the embodiment shown in FIGS. 2A, 2B, 3A, and 3B, and thus light collection efficiency of light to the photoelectric converters is lower than in the embodiment.

Figure 4A:
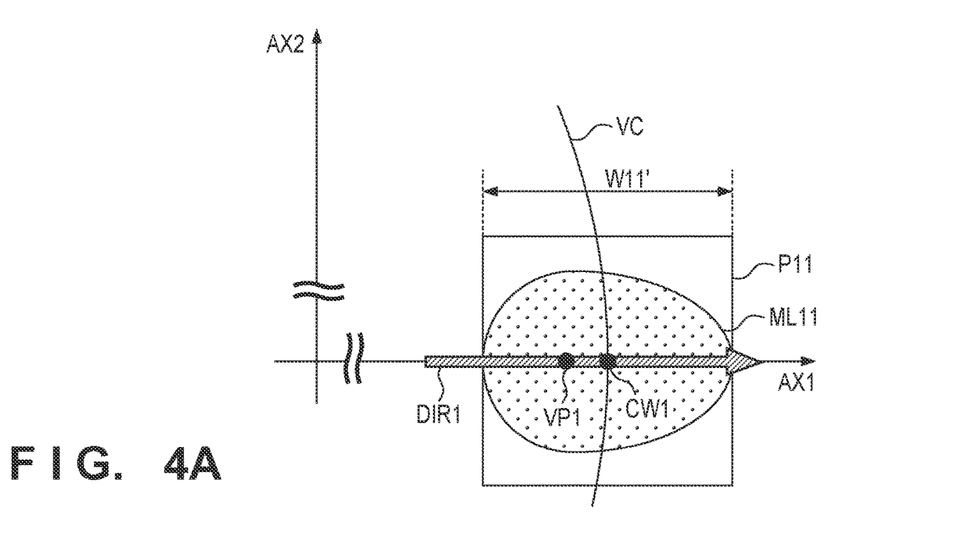
FIGS. 4A and 4B are views exemplarily showing the bottom shapes of the first microlens and the second microlens according to the second embodiment of the present invention.
Figure 4B:
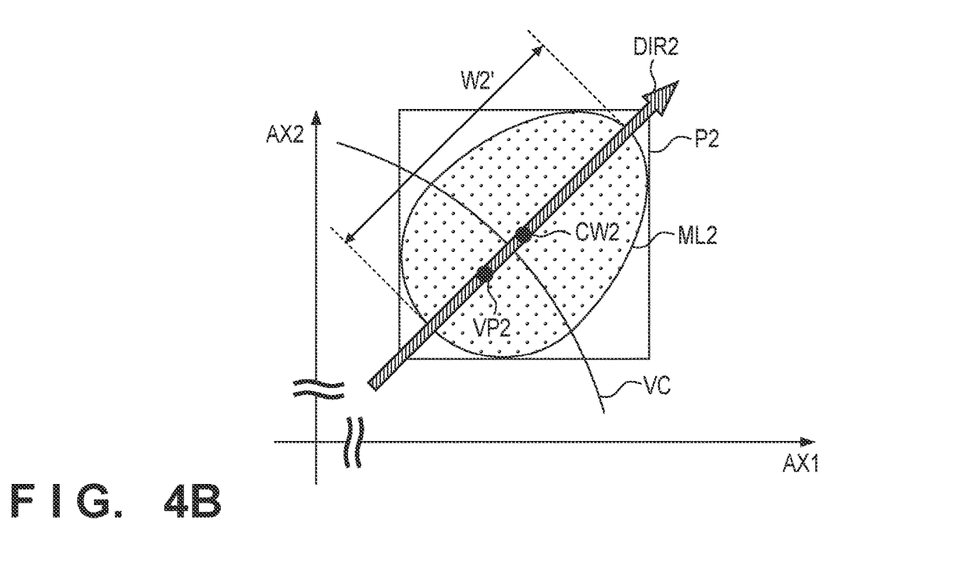
Figure 5A:
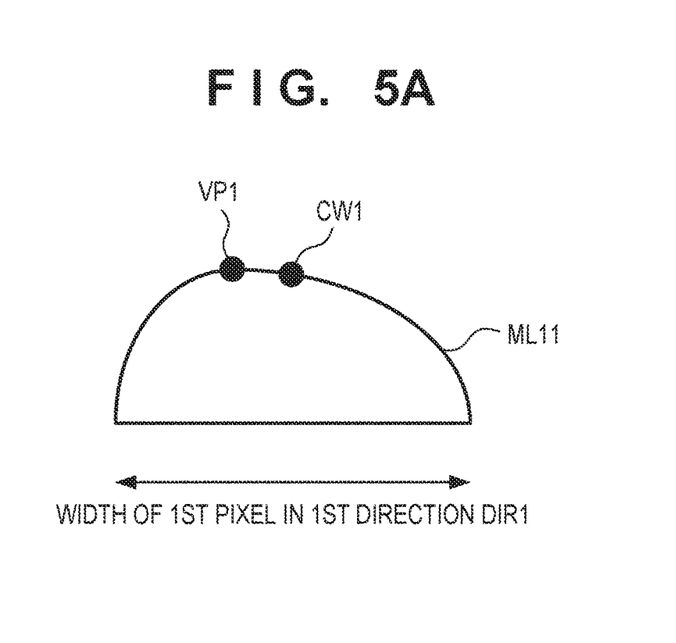
FIGS. 5A and 5B are views exemplifying the cross-sectional shapes of the first microlens and the second microlens shown in FIGS. 4A and 4B.
Figure 5B:
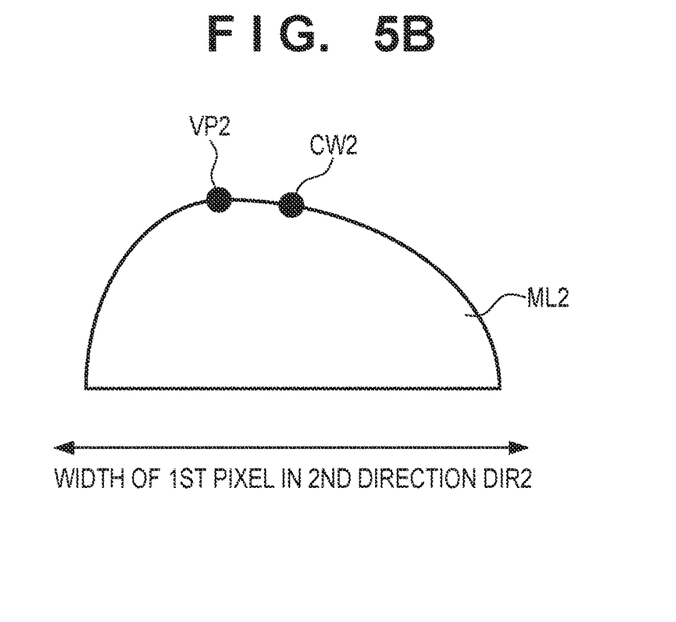

A solid-state image sensor 1 according to the second embodiment of the present invention will be described below with reference to FIGS. 4A, 4B, 5A, and 5B. Note that matters that are not mentioned in the second embodiment can comply with the first embodiment. FIGS. 4A and 4B exemplarily show the bottom shapes of a first microlens ML11 and a second microlens ML2 according to the second embodiment of the present invention. A width W2' of the second microlens ML2 in a second direction DIR2 passing through the second microlens ML2 and an array center C is larger than a width W11' of the first microlens ML11 in a first direction DIR1 passing through the first microlens ML11 and the array center C. Although not shown, the same also applies to first microlenses ML12, ML13, and ML14. FIG. 5A shows a cross-sectional shape obtained by cutting the first microlens ML11 shown in FIG. 4A along a straight line parallel to the first direction DIR1. FIG. 5B exemplarily shows a cross-sectional shape obtained by cutting the second microlens ML2 shown in FIG. 4B along a straight line parallel to the second direction DIR2. In one example, the cross-sectional shape of the second microlens ML2 cut along the straight line parallel to the second direction DIR2 may be similar to the cross-sectional shape of the first microlens ML11 (ditto for ML12, ML13, and ML14) cut along the straight line parallel to the first direction DIR1.

As an application of the solid-state image sensor according to the above-described embodiments, a camera in which the solid-state image sensor is assembled will exemplarily be described below. The concept of the camera includes not only an apparatus mainly aiming at shooting but also an apparatus (for example, a personal computer or a portable terminal) accessorily having a shooting function. The camera includes the solid-state image sensor according to the present invention exemplified as the above-described embodiments, and a processor which processes a signal output from the solid-state image sensor. The processor can include, for example, an A/D converter and a processor which processes digital data output from the A/D converter.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-099511, filed May 14, 2015, which is hereby incorporated by reference herein in its entirety.

What is claimed is:

1. A solid-state image sensor which includes a microlens array in which a plurality of microlenses are arrayed so as to constitute a plurality of rows and a plurality of columns,
wherein when a first axis parallel to the plurality of rows and passing through an array center as a center of the microlens array, and a second axis parallel to the plurality of columns and passing through the array center are defined, microlenses, out of the plurality of microlenses, positioned on a virtual circle having the array center as a center include a first microlens positioned on one of the first axis and the second axis, and a second microlens positioned on neither the first axis nor the second axis, each of the first microlens and the second microlens has a non-circular bottom shape, a width of the second microlens in a second direction passing through the second microlens and the array center is longer than a width of the first microlens in a first direction passing through the first microlens and the array center, and the first microlens has a line-symmetric shape with respect to a straight line parallel to the first direction as a symmetrical axis, and the second microlens has a line-symmetric shape with respect to a straight line parallel to the second direction as a symmetrical axis.

2. The sensor according to claim 1, wherein a top position of the first microlens is at a position shifted to a side of the array center from a center of the width of the first microlens in the first direction and a top position of the second microlens is at a position shifted to the side of the array center from a center of the width of the second microlens in the second direction.

3. The sensor according to claim 1, wherein a cross-sectional shape of the second microlens cut along a straight line parallel to the second direction includes a shape obtained by enlarging at least a part of a cross-sectional shape of the first microlens cut along a straight line parallel to the first direction.

4. The sensor according to claim 1, wherein a cross-sectional shape of the second microlens cut along a straight line parallel to the second direction is similar to a cross-sectional shape of the first microlens cut along a straight line parallel to the first direction.

5. The sensor according to claim 1, wherein a bottom outer edge of the first microlens includes a portion parallel to the first direction and a portion perpendicular to the first direction, and a bottom outer edge of the second microlens includes a portion parallel to the second direction and a portion perpendicular to the second direction.

6. The sensor according to claim 1, wherein letting $\theta$ be an angle formed by the first axis and the second direction, the width of the second microlens in the second direction is increased in accordance with an increase in $\theta$ in ranges of $0°<\theta\leq45°$, $90°<\theta\leq135°$, $180°<\theta\leq225°$, and $270°<\theta\leq315°$, and the width of the second microlens in the second direction is decreased in accordance with the increase in $\theta$ in ranges of $45°\leq\theta<90°$, $135°<\theta\leq180°$, $225°<\theta\leq270°$, and $315°<\theta\leq360°$.

7. The sensor according to claim 1, wherein the plurality of microlenses includes a third microlens positioned between the array center and the first pixel, and a fourth microlens positioned between the array center and the second pixel, each of the third microlens and the fourth microlens having a circular bottom shape.

8. A camera comprising:

a solid-state image sensor; and a processor configured to process a signal output from the solid-state image sensor, wherein the solid-state image sensor includes a microlens array in which a plurality of microlenses are arrayed so as to constitute a plurality of rows and a plurality of columns, and wherein when a first axis parallel to the plurality of rows and passing through an array center as a center of the microlens array, and a second axis parallel to the plurality of columns and passing through the array center are defined, microlenses, out of the plurality of microlenses, positioned on a virtual circle having the array center as a center include a first microlens positioned on one of the first axis and the second axis, and a second microlens positioned on neither the first axis nor the second axis, each of the first microlens and the second microlens has a non-circular bottom shape, a width of the second microlens in a second direction passing through the second microlens and the array center is longer than a width of the first microlens in a first direction passing through the first microlens and the array center, and the first microlens has a line-symmetric shape with respect to a straight line parallel to the first direction as a symmetrical axis and the second microlens has a line-symmetric shape with respect to a straight line parallel to the second direction as a symmetrical axis.

* * * * *